(12) United States Patent
Chou et al.

(10) Patent No.: US 6,428,659 B2
(45) Date of Patent: Aug. 6, 2002

(54) PROCESS OF COATING SUPER FINE PARTICLES OF MULTI-ELEMENT THIN FILM

(75) Inventors: Chung-Lin Chou; Chen-Chun Hsu, both of Taipei (TW)

(73) Assignee: Cosmos Vacuum Technology Corporation, Taipei (TW)

( * ) Notice: Subject to any disclaimer, the term of this patent is extended or adjusted under 35 U.S.C. 154(b) by 0 days.

(21) Appl. No.: 09/751,690

(22) Filed: Dec. 28, 2000

(30) Foreign Application Priority Data

Feb. 3, 2000 (TW) ........................ 89101936 A

(51) Int. Cl.[7] .............................. C23C 14/00
(52) U.S. Cl. ................. 204/192.38; 427/580; 427/523; 427/524; 427/530; 427/531; 204/192.16; 204/192.3
(58) Field of Search .................. 204/192.16, 192.3, 204/192.32, 192.38; 427/523, 524, 530, 531, 580

(56) References Cited

U.S. PATENT DOCUMENTS

| | | | |
|---|---|---|---|
| 4,871,434 A | * 10/1989 | Munz et al. | 204/192.16 |
| 4,876,984 A | * 10/1989 | Kinoshita et al. | 427/530 |
| 4,992,153 A | * 2/1991 | Bergmann et al. | 204/192.16 |
| 5,346,600 A | * 9/1994 | Nieh et al. | 204/192.3 |
| 5,384,018 A | * 1/1995 | Ramm et al. | 204/192.38 |
| 5,981,049 A | * 11/1999 | Ohara et al. | 428/216 |
| 6,239,543 B1 | * 5/2001 | Wakalopulos | 313/420 |

* cited by examiner

Primary Examiner—Rodney G. McDonald

(57) ABSTRACT

A process for coating super fine ion particles of multiple elements on the surface of a micro route substrate includes a coating step operated under low temperatures and vacuums. First, raw micro routers are cleaned by electron beams under atmospheric pressures and room temperatures, then the raw micro routers are transferred into a vacuum environment, and the temperature of the environment is increased to a range between 120° C. to 180° C. Next, the surface of the micro route is cleaned by ions, and then a coating process is started. An arc source is used to bombard cations from a target while a filtration net is used to pass small cation particles. An ion assistant device is operated to further refine the filtered particles so that only super fine ion particles are coated on the surface of the micro route substrates.

6 Claims, 2 Drawing Sheets

PROCESS OF COATING SUPER FINE PARTICLES OF MULTI-ELEMENT THIN FILM

FIELD OF THE INVENTION

This invention relates to the application principles of low temperature physical vapor deposition (PVD), ion cleaning, and ion coating to coat super fine ion particles of multiple elements on the surface of a micro route substrate to form a thin film, more specifically to coating zirconium (Zr), hafnium (Hf), carbon (C), nitrogen (N) multiple elements on the surface of a micro route substrate.

BACKGROUND OF THE INVENTION

A small route is usually installed on the computer numerical control (CNC) routing machine to route the material of a printed circuit board (PCB) via automatic operation. In a modern CNC routing machine operation plant, it is desirable to increase productivity. Besides, it is also desired by the vendors to increase the capacity of mass production without increasing the number of machines since the purchasing cost of the machines is usually the highest among manufacturing costs. Therefore, it is important for a vendor to get the route with higher cutting performance, better hardness, better wear-resistance, as well as longer life. It has been desirable to have better adhesive thin films, to get better quality of a coated micro route, which could bear higher rotation speed, further to increase the speed of feeding and thus to increase the capacity of cutting. However, it is not easy for the vendor to develop a process of coating a thin film with high adhesion to the substrate of a micro route. This invention is aimed to solve this problem by developing a process of coating a multiple-element thin film of ultra-fine ion particles on the substrate of a micro route.

Theoretically, it is possible to coat titanium nitride (TiN), titanium carbon nitride (TiCN) thin film on a large cutting micro route via physical vapor deposition (PVD)[, since it can] to enhance the hardness of micro routers, and raise cutting performance as well as enhance micro route's life. However, it is still impossible for the vendors to coat a thin film with better adhesion to the substrate of a micro route. In the prior art the processing of coating film is to clean the raw micro route in the presence of air first, and then proceed with coating under vacuums. In the coating process, ions bombarded from a target is not fined further by an ion assistant device or any other method.

When a coated micro route cools in the presence of air, oxide contaminations are easily formed on the surface of the coated micro route substrate. The coated materials are large particles having low adhesion to the micro route substrate when the coating process is an application of conventional physical vapor deposition (PVD). The coated micro route thereof does not have substantially higher hardness, enough tough internals, or higher wear-resistance, and the life of the coated micro route does not increase much. More importantly, it is difficult to coat a thin film on the surface of a raw micro route substrate so that the film has good adhesion to the substrate. Conventional chemical vapor deposition (CVD) is carried out at 950° C. which easily results in decreased toughness and decreased hardness of the coated micro route. Therefore, CVD will not do a good job for coating thin films on a micro route.

SUMMARY OF THE INVENTION

The object of this invention, therefore, is to provide a process of coating ZrxHfxCxNx multi-element thin film onto the surface of a micro route substrate. The materials coated are fine particles, and have good adhesion to the substrate. The coated materials remain on the surface even when the life of the coated micro route is over. The process time of this invention is also short. The coated micro route has hard surface, tough internals, good wear-resistance, good dissipation of heat, and longer life, and the size and appearance of the coated micro route as compared with raw micro routers remain the same.

Thus the further object of this invention is to provide a physical vapor deposition (PVD) process operated under low temperatures, i.e., a raw micro route is cleaned by electron beams in the presence of air, and then the raw micro route is put in a vacuum condition and heated. Next, the surface of the raw micro route is cleaned by ions, and finally the coating process is operated under low temperatures. This invention uses arc sources to bombard cations, uses a filtration net to get small cation particles, and at the same time uses an ion assistant device such as an ion gun to make the filtrated cations become smaller, which makes the coated materials fine particles and have good adhesion to the surface of the micro route substrate. The coated micro route has hard surface, tough internals, good wear-resistance, and the cutting speed and cutting precision thereof increase. The coated micro route has longer life and the process time is short. Conventional PVD and CVD can not coat films with good adhesion to the substrate of the micro route. This invention solves the problems that can not be solved by conventional PVD and CVD.

The other objects and characteristics of this invention are further described in accordance with the accompanying drawings.

Figure 1:
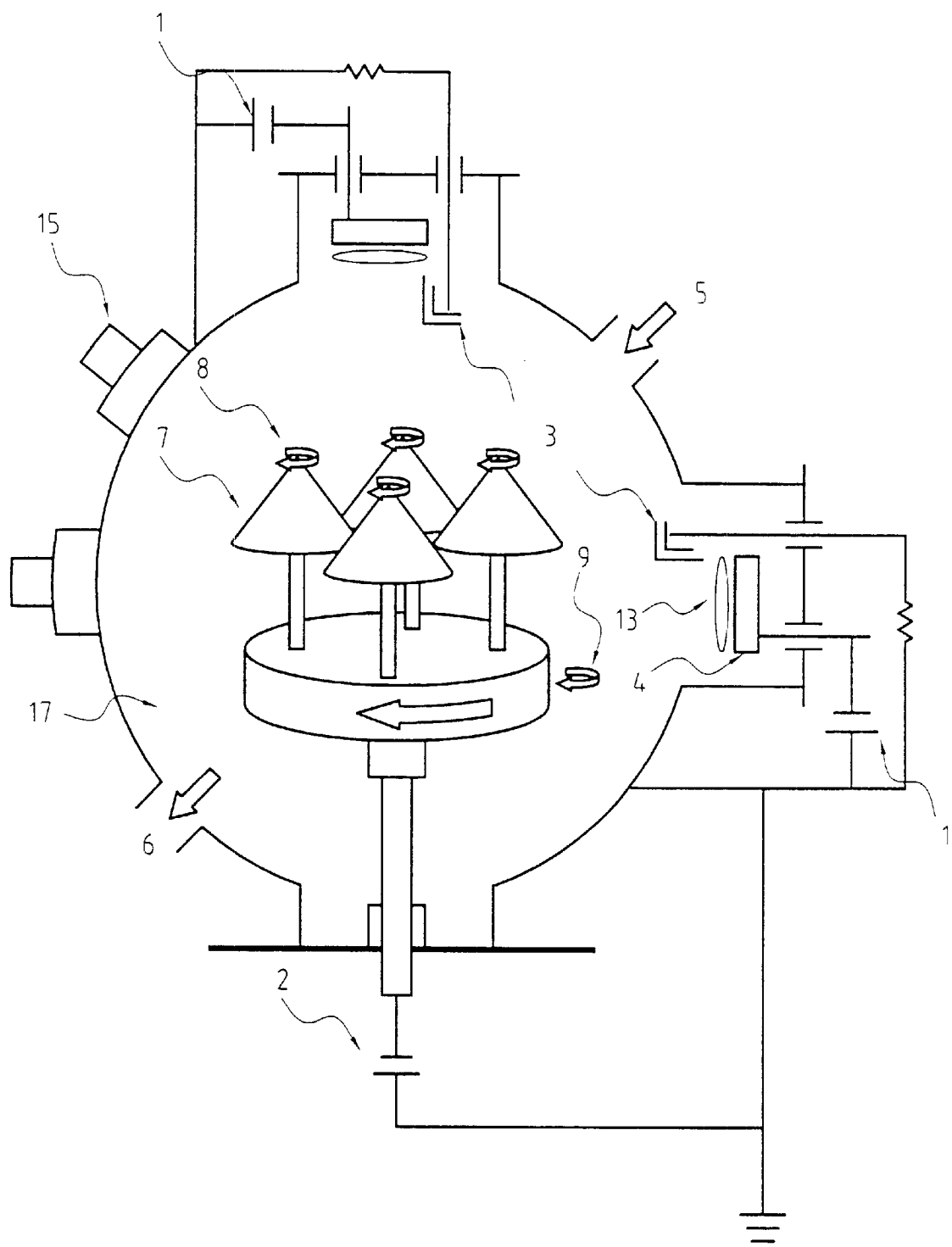
FIG. 1 is a simplified drawing of a PVD low temperature deposition system of this invention.
Figure 2:
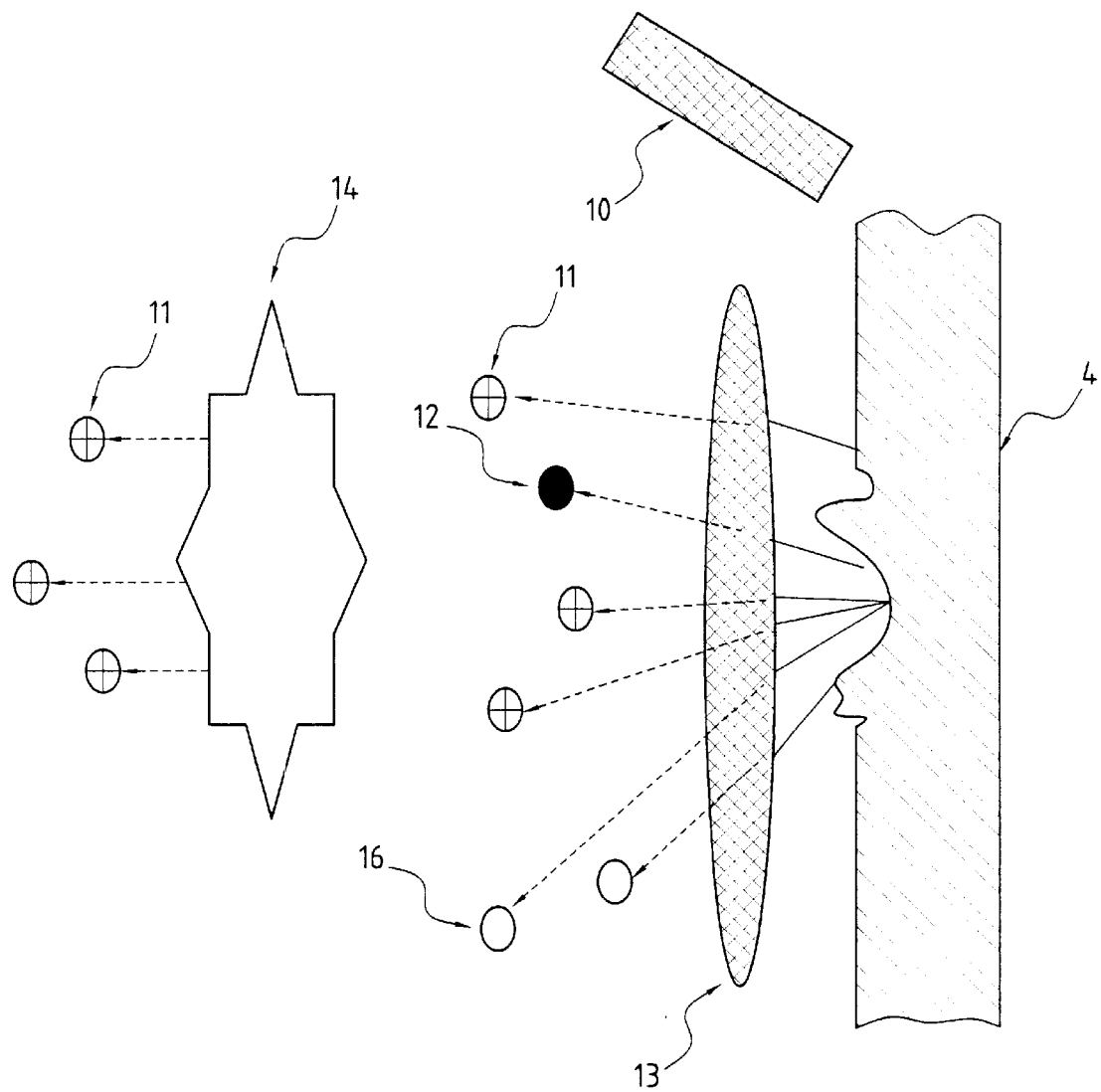
FIG. 2 shows the working principle of this invention.

The meanings of the reference numerals of FIG. 1 and FIG. 2 are shown in the following:

1 arc source
2 arc power supplier
3 touch off device
4 target
5 gas (nitrogen gas or reaction gas)
6 pump (diffusion pump and mechanical pump)
7 conical jig
8 spinning direction of conical jig 7
9 revolution direction of the working holder for conical jig 7
10 anodes
11 metal ion
12 evaporated metal atom
13 filtration net
14 plasma region
15 ion gun
16 micro droplet
17 vacuum chamber

DETAILED DESCRIPTION OF PREFERRED EMBODIMENTS

This invention discloses a process of coating multiple-element ZrxHfxCxNx on the surface of a raw micro route substrate using principles of low temperature PVD, ion cleaning, and ion coating. The diameter of the route is 0.2 mm–3.175 mm, and the substrate of the route is tungsten carbide (WC) or cermet. According to this invention, the multiple-element ZrHfCN could be coated onto the surface of the route substrate, forming 3–4 µm thickness thin film, so that the coated micro routers have the advantage of high hardness.

The process of this invention is illustrated as follows in accordance with FIG. 1:

a. Load raw micro routers onto a jig, proceed to treat them using electron beams and clean them under room temperatures and atmospheric pressures;

b. Transfer the jig into a vacuum chamber, proceed to vacuum the chamber, and warm the chamber up to 120° C.–380° C.;

c. Use an ion cleaning device to bombard ions to clean the surface of the raw micro route substrate, and this ion cleaning device may be an ion gun;

d. Proceed with coating process:
  (i) Operate arc sources to bombard ions from targets, and then use an ion assistant device such as an ion gun to further fine the bombarded ions more delicately;
  (ii) There is one metal filtration net between a target and raw micro routers to filter bombarded ions so that small ions pass through the net and large ions are blocked by the net. This filtration net is insulated by ceramics to avoid forming an electrode so that it is easy for small ions to pass through the net. Further, the passed small ions are refined to super fine particles by an ion gun and then only the super fine particles are coated on the surface of the micro route substrate;

e. Input $C_2H_2$ gas into the chamber;

f. Cool the coated routers using nitrogen ($N_2$) gas.

In the beginning of the process, raw micro routers are loaded onto a conical jig 7 (see FIG. 1). This invention overcomes the influence of gravitational force on substances in a vacuum chamber 17 using the conical jig 7. Before the coating step, the surfaces of the routers are cleaned by use of physical electron beams under room temperatures and atmospheric pressures, which makes the micro route substrate to be cleaned thoroughly. Surface treatment using electron beams is well known and practiced in the industry. After the cleaning and drying steps, the routers as well as the conical jig 7 are transferred into the vacuum chamber. After vacuuming the vacuum chamber, the vacuum chamber is heated. When the temperature of the vacuum chamber reaches a predetermined value, the surface of the raw route substrate is bombarded using an ion cleaning device such as an ion gun to bombard the ions in order to purge away dirt and oxidized substances, which are produced by the contact of the raw routers with air after the cleaning step.

After ion cleaning, a coating process, which is operated under vacuums, and low temperatures is started. Arc devices (see FIG. 1) comprising an arc source 1 and an arc power supplier 2 are employed to bombard metal ions from a target 4. Since it is possible that ions bombarded by the arc source 1 are large particles, this invention fines the bombarded metal ions by use of an ion assistant device such as an ion gun to make the bombarded particles smaller. The metal ions bombarded by the arc source 1 are assisted by an ion assistant device, i.e., an ion gun 15, which fines the bombarded ions, and thus the dimension of the fined ion particles is 1/20 of that of the unfined ion particles. Since the particle size is super fine, the particles adhere to the route substrate more easily, and the particles can be more compatible with other required element ions to form a multiple-element thin film. The surface of the film layer is smooth, and the thin film has high hardness, good adhesion to a route's substrate, and high density of the coated particles. Therefore, an ion assistant device is required in this invention.

In addition, between a target (exit of cations) and a raw micro route (see FIG. 2), one filtration net 13 designed according to the dimension of the raw micro route to filter ions is installed to decrease the speed of metal ions (cations) 11 so that it has more abundant time for the an assistant device to separate metal ions 11 to make small ions pass through the filtration net 13 while the larger ions are blocked by the filtration net 13. Only super fine particles are coated on the substrate of the micro routers. It can be sure that the coated micro routers have smooth surfaces as well as excellent cutting performance. Usually the filtration net 13 is made of metal, and the periphery of the filtration net is made of insulated materials such as ceramics. The filtration net does not form an electrode thereof and therefore the small ions can easily pass through the filtration net. The operation temperature of the coating step is 120° C.–380° C., which belongs to relatively low temperatures. Because this invention has the procedure of ion cleaning as well as ion assistant, the toughness of the coated micro route will not be reduced, the coated micro route has above two-fold hardness than before, and the coated film has good adhesion and good wear-resistance.

The conical jig 7 must make micro routers revolute in revolving direction 9 as well as spin in spin direction 8, and more importantly, the revolving direction and the spin direction can be clockwise as well as counterclockwise. Therefore, the film thickness of the blade as well as that of the back of the cutter can be controlled.

In the late stage of the coating step, nitrogen is used to fast cool micro routers, achieving the goal of hard surfaces and tough insides without affecting the adhesion of the coated materials, and shorten the process time. According to the process of this invention, the process time is 2–2.5 hours, which is shorter than the conventional coating process time. Besides, this invention is advantageous in that the particles coated onto the substrate of micro routers are super fine, the coated micro routers have smooth surfaces and the coated film has good adhesion. Usually the thickness of the thin film formed on the coated micro routers is between 3–4 µm, which will not impact the apparent dimensions of the cutting micro routers.

Nowadays the most widely used substrate of the micro route is a super-hard metal alloy comprising tungsten carbide (WC), tantalum carbide (TaC), cobalt (Co), and titanium carbide (TiC). The cermet containing titanium carbide (TiC) as a major component comprises tungsten carbide (WC), titanium nitride (TiN), tantalum carbide (TaC) and Colbalt (Co), and is better than superalloy in respect of temperature-resistance as well as wear-resistance. The micro route of this invention uses tungsten carbide (WC) super-hard alloy or cermet as the substrate. Since the thickness of a coated film is only 3 µm–4 µm, a micro route could not depend only on a coating layer to maintain its cutting capability. So cermet substrate has great impact upon characteristics of micro routers. Understanding the nature and characteristics of the coated substances, we decide target elements of this invention based on characteristics of materials to be cut, and thus we produce the best micro routers. This invention uses a tungsten carbide super-hard alloy or cermet as the substrate of micro routers. The target elements contain an alloy of zirconium (Zr) and hafnium (Hf), which are in the same family as titantium (Ti).

Coating at low temperatures: The process of physical vapor deposition operates at relatively low temperatures, 120° C.–380° C., which can avoid the decrease of toughness of coated material due to high temperatures. Besides, the coated micro routers have more than two fold hardness, and the adhesion and wear-resistance of the coated film also increase. Under such conditions, when other elements are coated, the elements have better adhesion. The coated film remains on the micro route under atmospheric pressures and room temperatures for a long time.

2. Using an ion assistant device: The ions bombarded from a target by an arc source are further fined to 1/20 of the dimension of the ions bombarded directly by the arc by use of an ion assistant device such as an ion gun. Since the fined ion is smaller, it adheres to the micro route substrate more easily. It is compatible with other required element ions to be coated and a stable multiple-element thin film can be formed. The degree of surface smoothness is high, and the hardness and the adhesion as well as the density of the film are also high.

3. Directing dissipation of heat: This invention will direct the heat produced to the bottom of the article (the micro route), i.e., the heat dissipates over the region of the micro route which does not have cutting functions. This invention can avoid the phenomena of "thermal stress" focus caused by the substrates of the micro routers, and can prevent the top of the micro routers from becoming the heat dissipating point. Without this invention, the heat dissipating point will result in poor adhesion of the coated material on the top of the coated micro routers and cause the film to fall off thereof.

4. Cleaning the surface of raw micro routers by electron beams: Before coating, clean the surface of raw micro routers using physical electron beams under atmospheric pressures and room temperatures as well as clean smears inside the raw micro route so that the raw micro route can be cleaned thoroughly.

5. Scopes of the application: It must be careful in practicing this invention since different coated materials and different shapes of raw micro routers have different requirements. Because different coated elements have different properties, this invention has a variety of operation methods under different operation temperatures, and different materials to be cut. Thus, there are many process variables for this invention. Lots of experiments have been run and a data base is built in accordance with different elements to be coated and different micro routers for a broad scope of applications.

EXAMPLE 1

The article to be coated is a micro route, the substrate of the micro route is cermet, and the route's diameter is 1.5 mm. The route's effective knife length is 8 mm, which is called raw Cosmos micro route hereinafter. According to the process of this invention, the target is zirconium (Zr), and hafnium (Hf) alloy, and the operation temperature of the coating step is 120° C.–380° C.

After completing the process of this invention, it is found that the coated material contains 65 wt % zirconium(Zr), 8 wt % carbon (C), and 12 wt % nitrogen (N) through element analysis, and the route is called coated Cosmos micro route hereinafter. The thickness of coated thin film is 3–4 $\mu$m. The hardness of the coated Cosmos micro route after coating is more than doubled when compared to the original substrate. The coated Cosmos micro route has increased wear-resistance, better heat-dissipation, unchanged dimensions, longer cutting life, and thus the productivity of routing machines is increased and the cost of the micro routers is decreased.

Route's Test Report:

Generally there are three key parameters for the micro routers used in routing machines.

1. Rotation speed: the speed of a micro route's rotation, representing a cutting rate of a micro route.
2. Feed speed: the speed of a micro route's movement, representing a cutting quantity of a micro route.
3. Micro route life: the highest usage quantity of a micro route, usually it is represented by a cutting length of the micro route, i.e., life for a micro route.

Now the test samples are raw Union micro route, coated Union micro route according to this invention, raw Cosmos micro route, and coated Cosmos micro route according to this invention. The diameters of the above-mentioned micro routers are all 1.5 mm, which have the same knife length, i.e., 8 mm. The test machine is LS-3B and LS-4B of Li-Son (using the axis of Hitachi ), FR (glass fiber rubber)-4 chipping board (the thickness is 1.6 mm, the dimension is 16"×18", the manufacturer is Formosa Plastic) is used to test the optimum operating condition of all the micro routers in comparing with their working efficiency as well as their lives. The test results are as follows:

1. Raw Union Micro Route:
   When rotation speed is 28–30 KRPM and feed speed is 14–16 mm/s, the raw Union micro route life is 20–40 m.
2. Coated Union Micro Route:
   When rotation speed is 28–32 KRPM and feed speed is 18–22 mm/s, the coated Union micro route life is 60–80 m.
3. Raw Cosmos Micro Route:
   When rotation speed is 28–32 KRPM and feed speed is 16–20 mm/s, the raw Cosmos micro route life is 40–60 m.
4. Coated Cosmos Micro Route:
   When rotation speed is 30–34 KRPM and feed speed is 24–32 mm/s, the coated Cosmos micro route life is 80–100 m.

Although the present invention has been disclosed as above, obviously, numerous modifications and variations of the present invention are possible in light of the above teachings to those who were skilled in the art. It is therefore to be understood that within the scope of the appended claims, the invention may be practiced otherwise than as specifically described herein.

What is claimed is:

1. A process of coating a multi-element thin film on a micro route substrate, comprising the steps of:

loading a raw micro route substrate onto a jig;

treating a surface of said raw micro route substrate using an electron beam under a room temperature and normal atmospheric pressure;

transferring said jig into a vacuum chamber;

vacuuming said chamber and heating said chamber to a temperature between 120° C. and 380° C.;

cleaning said surface of said micro route substrate using ions;

bombarding target elements using an arc source to free metal ions from said target elements;

filtering said metal ions with a filtration net to block larger ion particles and pass smaller ion particles;

refining said smaller ion particles passed through said filtration net using an ion assistance device;

coating said surface of said micro route substrate with ion particles refined by said ion assistance device;

sending $C_2H_2$ gas into said vacuum chamber; and cooling said micro route substrate using nitrogen;

wherein the steps of bombarding said target elements, filtering said metal ions, refining said smaller ion particles, and coating said surface of said micro route substrate are a physical vapor deposition process performed in said temperature between 120° C. and 380° C.

2. The process as claimed in claim 1, wherein the steps of bombarding said target elements, filtering said metal ions, refining said smaller ion particles, and coating said surface of said micro route substrate are a physical vapor deposition process performed in a temperature below 300° C.

3. The process as claimed in claim 1, wherein the step of refining said smaller ion particles reduces the size of an ion particle by a factor of 20 approximately.

4. The process as claimed in claim 1, wherein said micro route substrate comprises tungsten carbide (WC), and said target elements comprise an alloy of zirconium (Zr) and hafnium (Hf).

5. The process as claimed in claim 1, wherein said micro route substrate comprises cermet, and said target elements comprise an alloy of zirconium (Zr) and hafnium (Hf).

6. The process as claimed in claim 1, wherein said filtration net is insulated by ceramics and positioned between said arc source and said micro route substrate.

* * * * *